United States Patent [19]
Fried et al.

[11] Patent Number: 5,615,073
[45] Date of Patent: Mar. 25, 1997

[54] ELECTROSTATIC DISCHARGE PROTECTION APPARATUS

[75] Inventors: Rafael Fried, Caesarea; Yaron Blecher, Petach-Tikva; Shimon Friedman, Holon, all of Israel

[73] Assignee: National Semiconductor Corporation, Santa Clara, Calif.

[21] Appl. No.: 493,598

[22] Filed: Jun. 22, 1995

[51] Int. Cl.$^6$ ........................................ H02H 9/04
[52] U.S. Cl. ........................................ 361/56; 361/111
[58] Field of Search ........................... 361/56, 58, 91, 361/111; 257/355–363

[56] References Cited

U.S. PATENT DOCUMENTS

| | | | |
|---|---|---|---|
| 4,734,752 | 3/1988 | Liu et al. | 357/23.4 |
| 5,159,518 | 10/1992 | Roy | 361/56 |
| 5,162,888 | 11/1992 | Co et al. | 257/408 |
| 5,229,635 | 7/1993 | Bessolo et al. | 257/360 |
| 5,262,344 | 11/1993 | Mistry | 437/57 |
| 5,301,084 | 4/1994 | Miller | 361/91 |
| 5,329,143 | 7/1994 | Chan et al. | 257/173 |
| 5,345,357 | 9/1994 | Planka | 361/56 |

Primary Examiner—Brian K. Young
Assistant Examiner—Michael J. Sherry
Attorney, Agent, or Firm—Skjerven, Morrill, MacPherson, Franklin & Friel, L.L.P.

[57] ABSTRACT

A protection system for an integrated circuit includes a protection structure for the input terminals and output terminals that protects against ESD stress in bonding pad to $V_{SS}$ and bonding pad to $V_{DD}$ paths, both negative and positive paths. The protection system also includes a protection structure for protecting bonding pad to bonding pad electrical paths and a protection structure for $V_{DD}$ to $V_{SS}$ paths. Using all three protection structures in combination provides full protection against ESD events in all possible paths in an integrated circuit. A protection structure isolates an output buffer from the protection structure and encourages stress discharge through the protection structure rather than the output buffer. In addition, a set of design rules is set forth for the design and layout of the output buffer and protection structure including rules pertaining to transistor width, finger width, channel length, contact to gate spacing, and the like which significantly enhance ESD protection. In one embodiment, an electrostatic discharge (ESD) protection circuit connected to a pad of a semiconductor integrated circuit includes an NMOS transistor having a gate and a source/drain pathway connected between the pad and ground, a resistor connected between the NMOS transistor gate and ground, and a clamping transistor having a source/drain pathway connected between the NMOS transistor gate and ground and having a gate connected to the NMOS transistor gate. Supply taps are positioned at a distance removed from the NMOS transistor so that the substrate resistance at the NMOS transistor is elevated.

25 Claims, 11 Drawing Sheets

I-V char. of grounded gate NMOS.

Field oxide transistor
with Nwells under source and drain

Grounded gate NMOS
with p+N - diode.

Grounded gate NMOS
and PMOS.

No buffering resistor.

NMOS with gate
resistor to ground.

Clipping the NMOS gate at $V_T$.

Enhancing the NMOS bulk resistance.

n+P-substrate diode with p+N-diode.

p+/$N_{LDD}$ zener diode.

"punch-throughs".

No device from pad to $V_{DD}$ 5,615,073

ELECTROSTATIC DISCHARGE PROTECTION APPARATUS

FIELD OF INVENTION

The present invention relates to integrated circuit structures and, more specifically, to electrostatic discharge protection circuits in CMOS integrated circuits.

BACKGROUND OF THE INVENTION

CMOS integrated circuit devices are vulnerable to electrostatic discharge (ESD) induced failure. ESD events or spikes are typically short-duration, high-voltage electrical pulses that are caused, for example, by discharge of a static charge. ESD causes failure of a MOS integrated circuit device by overheating components due to overcurrent, breakdown of thin oxide or other conditions. ESD can damage or destroy integrated circuit devices unless measures are taken to reduce ESD effects on the input pins and output pins of the devices. Various techniques have been used to self-protect output buffers or other input-output nodes against ESD failures. Some of these measures include diode clamps, lateral punch-through devices and guard ring collectors around an input-output bonding pad. These circuits are reasonably effective for protecting input circuits but are less effective for protecting output circuits from high transient voltages.

ESD protection structures are classified into two categories including structures to protect of input buffers and structures to protect output buffers and I/O (input and output) nodes. Protection of input buffers is relatively simple because a CMOS gate does not conduct current. Accordingly, a special protection structure is implemented on the input buffer which restricts the gate voltage of a transistor to a maximum of $BV_{ox}$—the oxide breakdown voltage—to hold the charges that enter the oxide as low as possible and much lower than $Q_{BD}$—the charge which causes breakdown.

In contradistinction, the second category of output buffers and input-output nodes includes structures that are more difficult to protect. This difficulty results because the output buffer may conduct current during ESD stress, and thus may be damaged. Under ESD stress conditions, the protection structure must be designed and layout constructed so that the protection structure discharges the ESD stress without self-damage while the output buffer conducts only a minimum current.

What is needed is an integrated circuit protection structure and fabrication method which improves ESD protection levels, offers ESD protection for ESD spikes in all directions and polarities and requires no additional process steps.

SUMMARY OF THE INVENTION

In accordance with the present invention, a protection system for an integrated circuit includes a protection structure for the input terminals and output terminals that protects against ESD stress in bonding pad to $V_{SS}$ and bonding pad to $V_{DD}$ paths, both negative and positive paths. The protection system also includes a protection structure for protecting bonding pad to bonding pad electrical paths and a protection structure for $V_{DD}$ to $V_{SS}$ paths. Using all three protection structures in combination provides full protection against ESD events in all possible paths in an integrated circuit.

In accordance with the present invention, a protection structure isolates an output buffer from the protection structure and encourages stress discharge through the protection structure rather than the output buffer. In addition, a set of design rules is set forth for the design and layout of the output buffer and protection structure including rules pertaining to transistor width, finger width, channel length, contact to gate spacing, and the like which significantly enhance ESD protection.

In accordance with a first embodiment of the present invention, an electrostatic discharge (ESD) protection circuit connected to a pad of a semiconductor integrated circuit includes an NMOS transistor having a gate and a source/drain pathway connected between the pad and ground, a resistor connected between the NMOS transistor gate and ground, and a clamping transistor having a source/drain pathway connected between the NMOS transistor gate and ground and having a gate connected to the NMOS transistor gate. Supply taps are positioned at a distance removed from the NMOS transistor so that the substrate resistance at the NMOS transistor is elevated.

In accordance with a second embodiment of the present invention, an electrostatic discharge (ESD) protection circuit connected to a pad of a semiconductor integrated circuit includes a first NMOS transistor having a gate connected to ground and a source/drain pathway connected between the pad and ground, a second NMOS transistor having a source/drain pathway connected between a VDD supply voltage source and the pad, and a resistor connected between the gate of the second NMOS transistor and the pad.

Several advantages are achieved by the disclosed protection structure and fabrication method. One advantage is that integrated ESD protection is provided for ESD spikes in all directions and of all polarities, including bond pad to VSS for positive and negative spikes, bond pad to VDD for positive and negative spikes and bond pad to bond pad. A second advantage is that no additional process steps are utilized beyond standard typical CMOS process steps. A further advantage is that ESD protection is enhanced yielding a very high ESD protection threshold of more than 10 kV. A further advantage is that the disclosed protection structure consumes a small area, the size of which is dictated by the pad's pitch.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION

Figure 1:
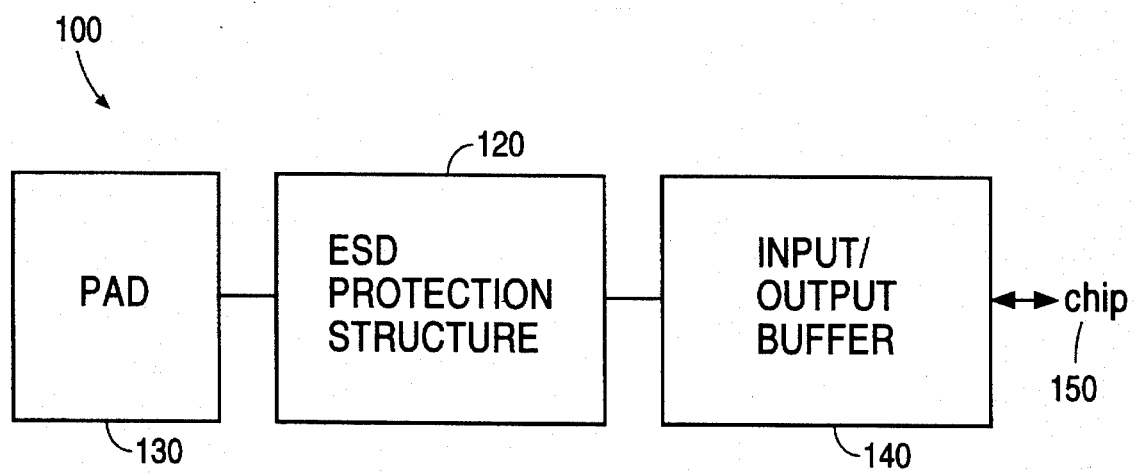
FIG. 1 is a schematic block diagram illustrating an environment in which an electrostatic discharge protection circuit in accordance with the present invention is employed.

FIG. 1 illustrates an environment 100 in which an electrostatic discharge (ESD) protection circuit 120 is typically employed. In particular, the ESD protection circuit 120 is connected to a bonding pad 130 and an input/output buffer 140 which is connected to an integrated circuit chip 150. In additional embodiments of ESD protection circuits, such circuits are utilized to protect bonding pads which are connected to voltage supply and reference sources such as $V_{DD}$ so that no input/output buffer connection is included.

Figure 2:
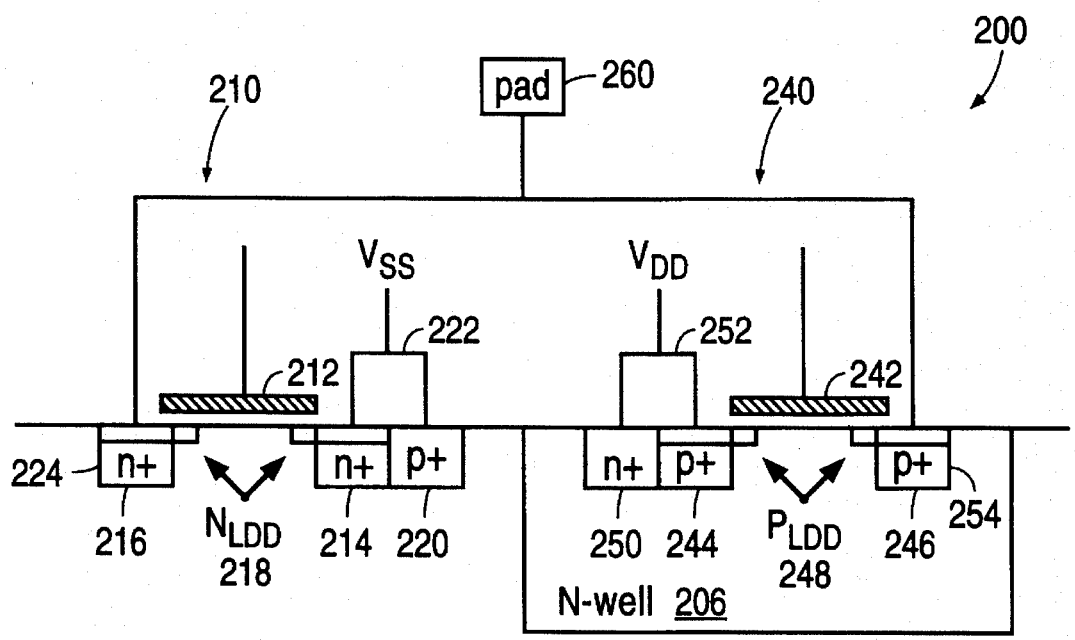
FIG. 2 is a cross-sectional view of a semiconductor wafer showing a CMOS output stage.

Referring to FIG. 2, a CMOS output stage 200 is shown to illustrate various concepts applicable to integrated circuit behavior and, specifically, integrated circuit protection structure behavior under ESD conditions. The CMOS output stage 200 includes an n-channel MOS (NMOS) transistor 210 and a p-channel MOS (PMOS) transistor 240. NMOS transistor 210 is formed in a P-type epitaxial layer 204 which is grown over a P-type substrate 202. NMOS transistor 210 has an N+ doped drain 216, an N+ doped source 214, an N– lightly doped drain (LDD) region 218 and a gate 212. A N+P– junction 224 forms a boundary between the drain 216 and the epitaxial layer 204. The source 214 and body 220 of NMOS transistor 210 are connected to a VSS ground reference 222. PMOS transistor 240 is formed in an N doped N-well 206 in the P-type epitaxial layer 204. PMOS transistor 240 has a P+ doped drain 246, a P+ doped source 244, a P– lightly doped drain (LDD) region 248 and a gate 242. The drain 216 of the NMOS transistor 210 and the drain 246 of the PMOS transistor 240 are mutually connected to a bond pad 260. A P+N– junction 254 forms a boundary between the drain 246 and the N-well 206. The source 244 and body 250 of PMOS transistor 240 are connected to a VDD supply 252.

Figure 3:
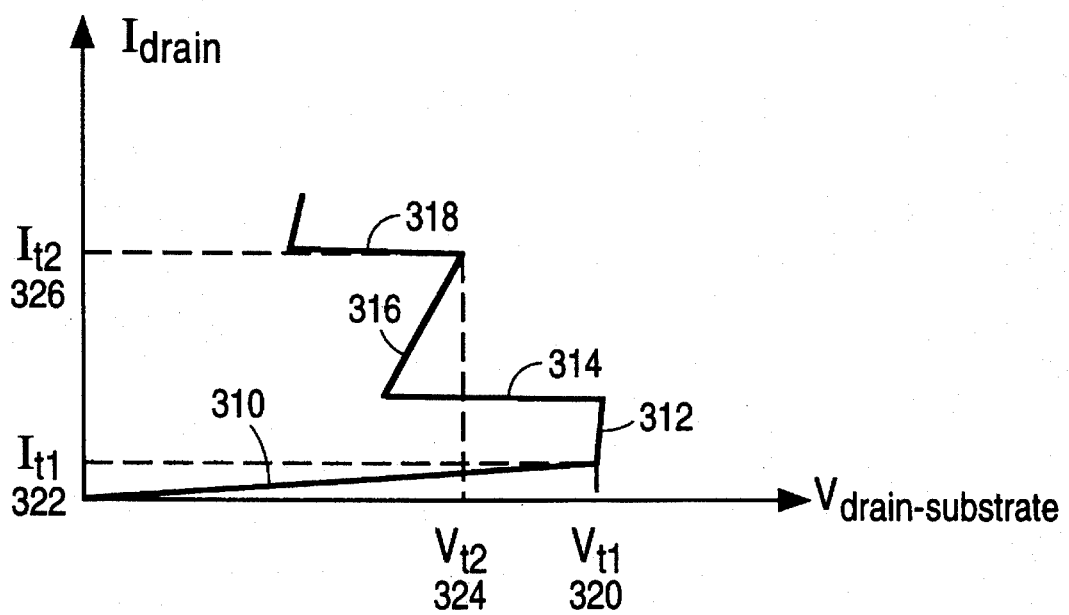
FIG. 3 is a graph which illustrates a current-voltage characteristic of a grounded gate NMOS transistor.

The gate 212 of NMOS transistor 210 is connected to the ground reference to form a grounded-gate NMOS transistor 210 which functions as an ESD protection structure. Referring to FIG. 3, in conjunction with FIG. 2, a current-voltage characteristic of the grounded-gate NMOS transistor 210 is shown. When an ESD spike that is positive with respect to VSS is applied to the drain 216 of NMOS transistor 210, the drain voltage 310 rises to the magnitude $V_{t1}$ 320. At voltage $V_{t1}$ 320 and corresponding current $I_{t1}$ 322, the N+P– junction 224 of the drain 216 undergoes avalanche breakdown 312 in which the electrical field arising from the ESD spike causes a cumulative multiplication of free charge carriers. The free charge carriers gain sufficient energy to liberate additional electron-hole pairs by impact ionization. A flow of holes at the substrate 202, created by impact ionization, raises the potential at the substrate 202 and causes a junction between the source 214 and epitaxial layer 204 to become forward biased. As a result, snap-back 314 occurs in an effective lateral NPN transistor (not shown) formed by the source 214, the epitaxial layer 204 and drain 216. Drain current increases 316 until a second breakdown 318 occurs at a voltage magnitude of $V_{t2}$ 324 and current of $I_{t2}$ 326. The second breakdown 318 results from a thermal runaway accompanied by current instability caused by the onset of current filaments. Current filaments are wire-like structures that conduct current in the integrated circuit. When thermal runaway takes place, current flow becomes nonuniform and current conduction takes place in the thin filaments. Typically, a semiconductor device is damaged when the current reaches the magnitude $I_{t2}$ 326.

Figure 4:
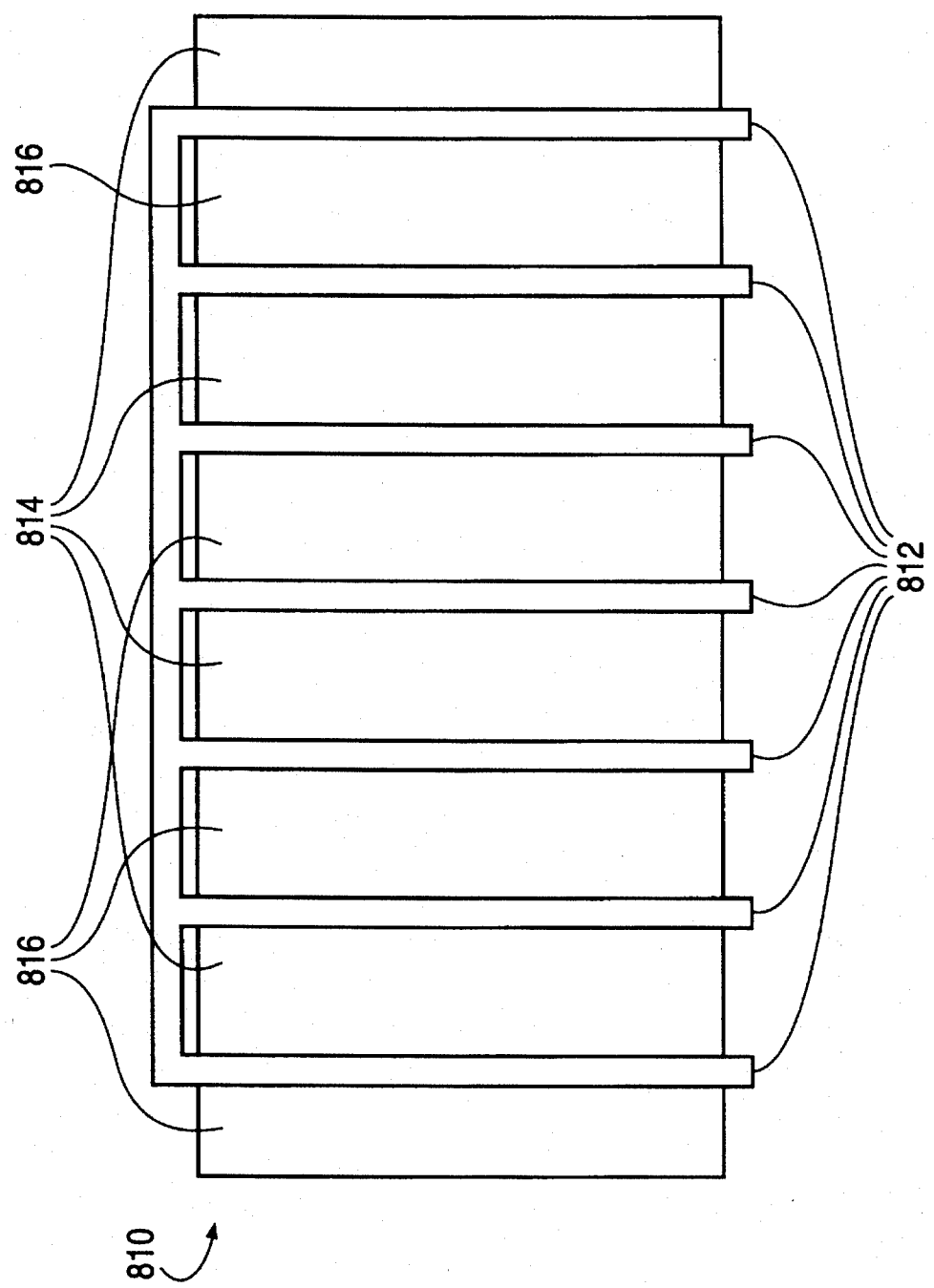
FIG. 4 is a cross-sectional view of a semiconductor wafer illustrating fingers of a MOS transistor.

Integrated circuit protection is increased by lowering the first breakdown voltage $V_{t1}$ 320 below the magnitude of the second breakdown voltage $V_{t2}$ 324 so that thermal runaway due to ESD stress occurs at higher magnitudes of ESD voltage. Lowering the first breakdown voltage $V_{t1}$ 320 is particularly effective when multiple finger transistors are used. In a multiple finger transistor, additional fingers are activated, thereby increasing the thermal runaway current $I_{t2}$ 326 before the semiconductor device reaches a thermal breakdown condition. Referring to FIG. 4, a cross-sectional view of a semiconductor wafer is shown, which illustrates fingers 812 of a MOS integrated circuit 810. The fingers 812 are positioned between alternating transistor source regions 814 and transistor drain regions 816.

When an ESD spike that is negative with respect to VSS is applied to the drain 216 of NMOS transistor 210, the N+P– junction 224 functions as a forward-biased diode and discharges the ESD stress.

Referring again to FIG. 2, the PMOS transistor 340 is a suitable protection structure for protecting against ESD spikes applied to the bond pad 260. When an ESD spike that is positive with respect to VDD is applied to the drain 246 of PMOS transistor 240, the P+N– junction 254 functions as a forward-biased diode and discharges the ESD stress. However, for an ESD spike that is negative with respect to VDD is applied to the drain 246 of PMOS transistor 240, the P+N– junction 254 functions in a backward-biased condition, undergoes avalanche breakdown and discharges the ESD stress.

Figure 5:
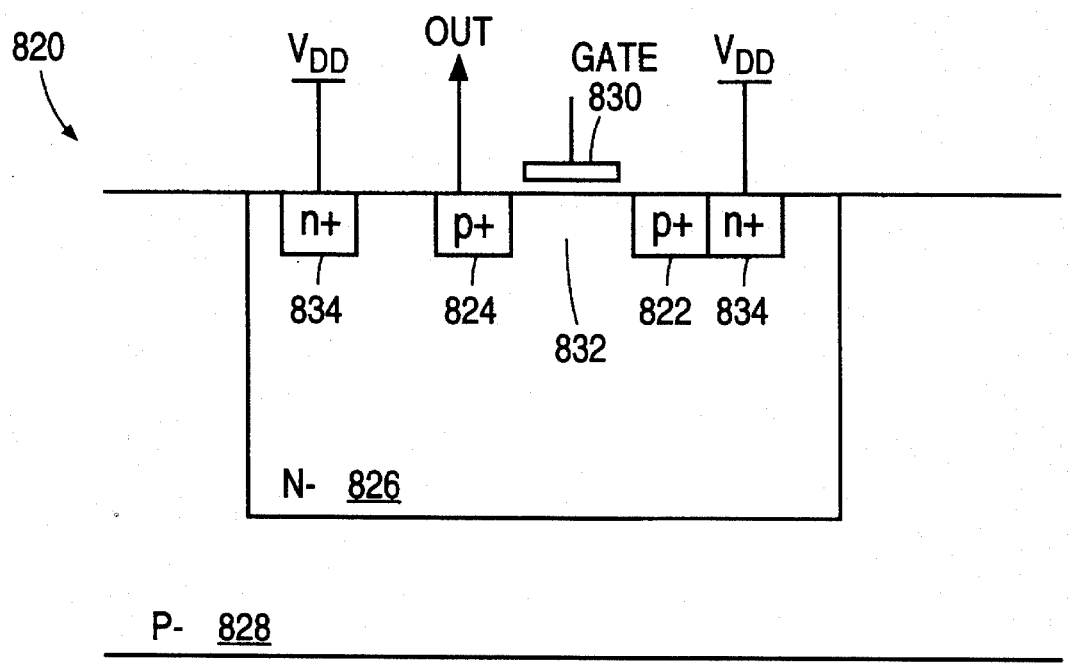
FIG. 5 is a cross-sectional view of a semiconductor wafer illustrating a transistor and supply taps.

The effectiveness of the P+N– junction 254 operation as a diode is improved by reducing the series resistance of the junction 254. The series resistance is reduced by increasing the number of supply taps and connecting the taps at a minimum distance from the drain 246. Referring to FIG. 5, a cross-sectional view of a PMOS transistor 820 in a semiconductor wafer is shown. The PMOS transistor 820 includes a P+ source 822 and a P+ drain 824 in an N-well 826. The N-well 826 is formed in a P– substrate layer 828. A gate 830 overlies a channel 832 between the source 822 and drain 824. Additional supply taps 834 are diffused into the N-well 826 to reduce series resistance.

For the PMOS transistor 240 to operate in a snap-back region of a current-voltage characteristic, electrons that conduct in the N-well 206 following drain junction avalanche breakdown forward bias the junction between the source 244 and N-well 206 so that a lateral PNP transistor formed by the source 244, the N-well 206 and the drain 246 is activated.

In contradistinction to the NMOS transistor 210, the operation of the parasitic lateral bipolar PNP transistor is ineffective to cause a snap-back affect due to the lower injection efficiency of the parasitic PNP transistor as compared to the NPN transistor of the NMOS transistor 210 and a lower resistance of the N-well 206 as compared to the epitaxial layer 204.

Figure 6:
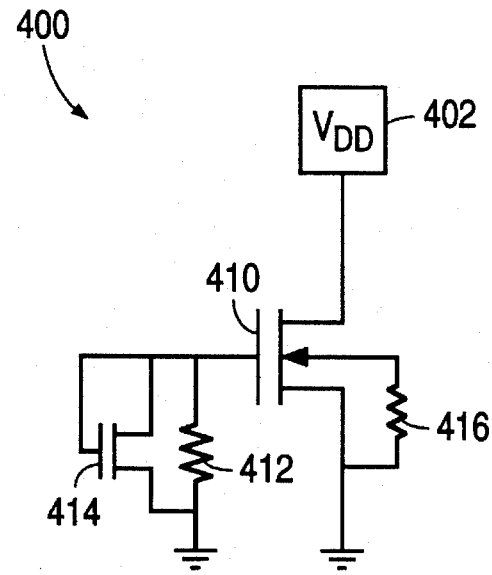
FIG. 6 is a schematic circuit diagram illustrating a protection structure for connecting between $V_{DD}$ and $V_{SS}$ in an integrated circuit.

Referring to FIG. 6, a protection structure 400 is connected between $V_{DD}$ and $V_{SS}$ of an integrated circuit (not shown) to prevent the $V_{DD}$ potential from rising above the snap-back voltage of an NMOS transistor 410, approximately 8 volts, during ESD stress. The protection structure 400 has a basic structure formed by a grounded-gate NMOS transistor 410. The grounded-gate NMOS transistor 410 protects against bond pad 402 to $V_{SS}$ positive and negative ESD events. A resistor 412 is connected between the gate terminal of NMOS transistor 410 and ground. Resistor 412 allows the potential at the gate terminal of NMOS transistor 410 to rise during an ESD event at the bond pad 402 which is positive with respect to the $V_{SS}$ potential. During such an ESD event, the potential at the gate terminal is elevated due to capacitive coupling between the drain and gate of NMOS transistor 410. However, a clamping transistor 414 has a source drain pathway which is connected across the resistor 412 to limit the potential at the gate terminal of NMOS transistor 410 to a maximum of the threshold voltage $V_T$. The clamping transistor 414 has a gate terminal connected to the gate of NMOS transistor 410.

Resistor 412 and clamping transistor 414 act in concert, respectively, to enable an increase in gate potential of NMOS transistor 410 and to limit or clamp the gate potential, thereby decreasing sharply the breakdown voltage $V_{t1}$ due to a substantially linear relationship between drain current of a transistor and an impact ionization current. The increase in gate potential also lowers the electric field near the drain and therefore lowers the impact ionization which causes snap-back voltage to rise. Accordingly, the increased gate potential leads to a weak increase in snap-back voltage. A gate potential of approximately $V_T$ yields an optimal balance of breakdown voltage reduction and snap-back voltage increase.

An elevated substrate resistance 416 is formed at the source NMOS transistor 410 by placing supply taps of the NMOS transistor 410 a predetermined distance removed from the transistor 410, enabling snap-back at a lower drain current magnitude. The distance the supply taps are removed is determined according to the substrate resistance.

Figure 7:
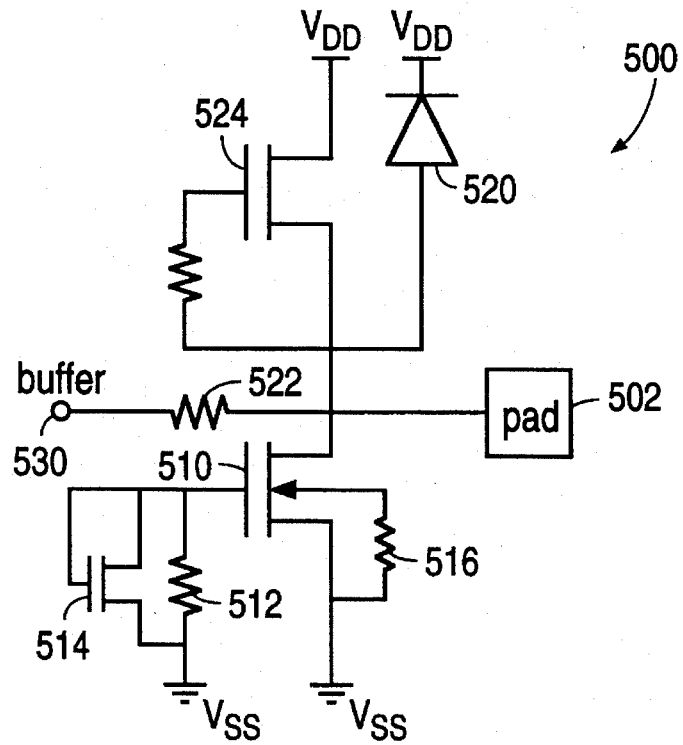
FIG. 7 is a schematic circuit diagram illustrating a protection structure for connecting an integrated circuit to an input terminal or an output terminal.

Referring to FIG. 7, a protection structure 500 for connecting a buffer 530 of an integrated circuit (not shown) to an interconnect terminal bond pad 502. In various embodiments, buffer 530 is either an input buffer or an output buffer and the interconnect terminal bond pad 502 is correspondingly either an input terminal or an output terminal. An output buffer is difficult to protect since the output buffer itself may conduct current during ESD stress, and thus be damaged. Accordingly, the protection structure 500 is structured and has a layout formed so that the protection structure 500 discharges ESD stress without self-damage while significantly limiting current conduction through the output buffer.

Like the protection structure 400 shown in FIG. 6, protection structure 500 has a basic structure formed by a grounded-gate NMOS transistor 510 which protects against bond pad 502 to $V_{SS}$ positive and negative ESD events. A resistor 512 connected between the NMOS transistor 510 gate and ground allows the NMOS transistor 510 gate to rise during an ESD event at the bond pad 502 which is positive with respect to the $V_{SS}$ potential. A clamping transistor 514 is connected across the resistor 512 to limit the potential at the NMOS transistor 510 gate to a maximum of the threshold voltage $V_T$. An elevated substrate resistance 516 is formed between the source and backgate of NMOS transistor 510 by placing supply taps of the NMOS transistor 510 a predetermined distance removed from the transistor 510, enabling snap-back at a lower drain current magnitude.

The protection structure 500 also includes a P+N− diode 520 and an NMOS transistor 524, each connected between the $V_{DD}$ power supply and the interconnect terminal bond pad 502. The P+N− diode protects against ESD events which are either positive or negative with respect to the supply voltage $V_{DD}$. The NMOS transistor 524 enhances the ESD protection in this path.

Furthermore, the protection circuit 500 includes a diffusion resistor 522 connected to the NMOS transistor 510 drain to furnish isolation between the protection structure 500 and an buffer 530 of an integrated circuit. The isolation between the buffer 530 and the protection structure 500 furnished by the diffusion resistor 522 encourages ESD stress discharge through the protection structure 500 and not the buffer 530. A parasitic diode (not shown) inherent accompanies the diffusion resistor 522. The parasitic diode gives rise to electric fields that possibly result in breakdown of the diffusion resistor 522.

Figure 8:
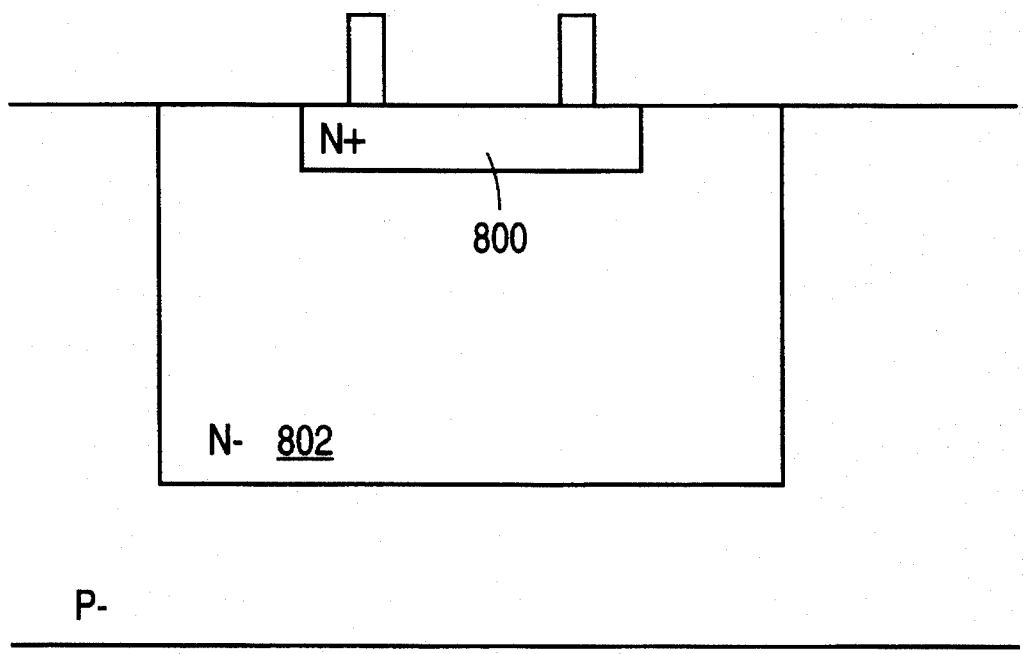
FIG. 8 is a cross-sectional view of a semiconductor wafer illustrating a diffusion resistor and well tabs.

In some embodiments of the protection structure 500, to prevent breakdown, a well tab is placed under the diffusion resistor 522 because a well generally has a relatively high breakdown voltage. Referring to FIG. 8, a cross-sectional view of a semiconductor wafer shows a heavily-doped N+ diffusion resistor 800 formed in a N− doped N-well 802.

Various aspects of layout, fabrication and structure are applied to the protection structures 400 and 500 and protected buffer 530, shown in FIGS. 6 and 7, to determine ESD performance of an integrated circuit. These aspects relate to a transistor's total width, finger width, channel length, contact to gate spacing, and the like enhance ESD protection of an output buffer, alone or in combination with a protection structure.

A first aspect is the contact to gate spacing (CGS) of the source (SCGS) and drain (DCGS) of MOS transistors in the protection structures 400 and 500 and buffer 530. Contact to gate spacing greatly influences ESD performance in an integrated circuit for the following reasons. An increased contact to gate spacing increases the differential resistance for snap-back, advantageously increasing the second breakdown voltage $V_{t2}$ (324 shown in FIG. 3), and increases the ballasting resistance at the finger's drain. The drain contact to gate spacing (DCGS) is more important for current stability than is source contact to gate spacing (SCGS) so that a suitable SCGS is typically smaller than a suitable DCGS. However, an increase in the series resistance of a bipolar transistor increases power dissipation so that reducing the contact to gate spacing of the source (SCGS) is advantageous for saving device power dissipation. A suitable range of drain contact to gate spacing (DCGS) is 4 μm to 6 μm with preferred values of approximately 4 μm for protection structure transistors and approximately 2 μm for output buffer transistors. A suitable range of source contact to gate spacing (SCGS) is 1 μm to 2 μm with a selected value of approximately 1.5 μm for protection structure transistors and approximately 1 μm for output buffer transistors.

A second aspect is channel width (W) of MOS transistors in the protection structures 400 and 500 and buffer 530. When a transistor's current flow is uniform, the magnitude of thermal runaway current $I_{t2}$ is linearly proportional to channel width (W) so that a higher failure threshold results from increasing channel width (W). However, current flow is generally nonuniform as only a few fingers of a transistor conduct current so that channel width may be unreliable for avoiding device failures due to a random number of conducting fingers. Channel width W typically ranges from a minimum width of about 400 μm. However, transistors in the protection structures 400 and 500 have a channel width of approximately 400 μm and transistors in the buffer 530 have a minimum channel width of about 100 μm.

A third aspect is Channel Length (L) of MOS transistors in the protection structures 400 and 500 and buffer 530. Reducing channel length causes a decreased snap-back voltage so that the ESD failure threshold is advantageously increased. Furthermore, an elevated snap-back voltage causes higher power dissipation when a bipolar transistor operates in the snap-back region. Decreasing the channel length decreases the snap-back voltage and thus increases the ESD failure threshold. Higher snap-back voltage causes higher power dissipation when the bipolar transistor operates at the snap-back region. It is typically recommended that the channel length be set to the shortest length possible using suitable fabrication techniques. For example, a suitable channel length for transistors in the protection structures 400 and 500 is 0.8 μm. A longer channel length may be used in the output buffer transistors.

A fourth aspect is finger width of MOS transistors in the protection structures 400 and 500 and buffer 530. Usage of wider fingers increases the thermal runaway current $I_{t2}$ of a single finger so that a larger current runs through the finger without causing damage to the finger during an ESD event. Finger width is limited to prevent flow of nonhomogeneous current across the finger. A single finger has a typical width 50 μm or larger. Both the protection structures 400 and 500 and the buffer 530 advantageously have a fully symmetric finger structure, using an even number of fingers with the fingers laid in straight lines with substantially no bending.

A fifth aspect is the number of supply taps in the integrated circuit. As many supply taps as possible, as constrained by spacing considerations on an integrated circuit, are positioned as near as possible to the sources of the transistors in the buffer 530. However, supply taps are positioned as great a distance as is possible from the transistors of protection structures 400 and 500 so long as latch-up rules, as are known in the art of integrated circuit fabrication, are not violated.

A sixth aspect is the usage of a lightly-doped drain (LDD) diffusion at the drain and source of a MOS transistor. The inclusion of LDD diffusion to a drain and source of a transistor degrades ESD immunity of the transistor. The LDD reduces the depth of a junction, elevating the current density (J) and power dissipation at the junction edge. Higher temperatures in the integrated circuit and transistor damage result. Furthermore, usage of lightly-doped drain increases snap-back voltage due to a lower electric field in the channel of a transistor. A reduced snap-back voltage results in a lowered intensity of an electric field at the base-collector junction during bipolar operation. In accordance with these considerations, the LDD structures are omitted from the transistors of protection structures 400 and 500 and included in transistors in the buffer 530.

A seventh aspect is that the N-well is placed beneath drain contacts of a MOS transistor in the protection structures 400 and 500 to prevent contact spiking ESD events. Furthermore, the maximum possible number of contacts, as constrained by spacing considerations on an integrated circuit, are utilized and distributed uniformly along the drain so that current flow along metal lines and in the diffusions is uniform.

The aforementioned seven aspects are applicable to the bond pad to VSS path and to the bond pad to VDD path when a pull-up transistor of the buffer 530 is an NMOS transistor. When a PMOS transistor is used as the pull-up transistor, the diode serial resistance of the PMOS transistor is reduced by increasing the number of supply taps and connecting the taps at a minimum distance from the PMOS transistor drain 246.

Figure 9:
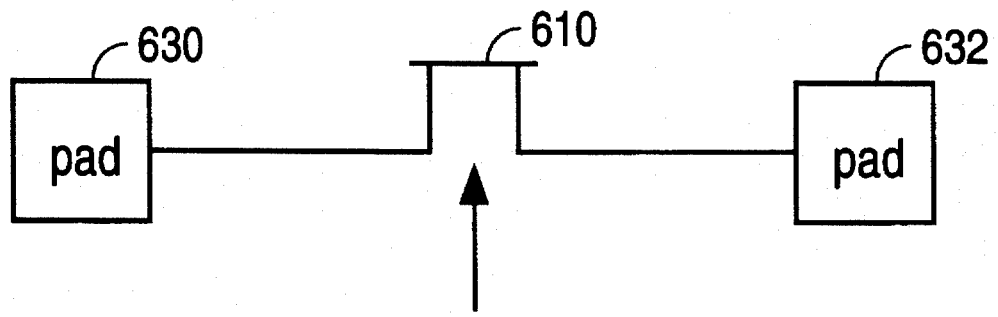
FIG. 9 is a schematic circuit diagram showing a protection structure for protecting against unintended electrical event transmission between closely spaced pads.

Referring to FIG. 9, a protection structure 600 is shown which protects against unintended electrical event transmission between closely spaced pads 630 and 632. The protection structure 600 includes a field oxide transistor 610 with N-wells (not shown) formed under the source and drain of the transistor 610. In one embodiment, the field oxide transistor 610 is an NMOS transistor including drain and source diffusions and a thick oxide layer between the drain and source, but not having a gate.

Other Embodiments

Referring to FIGS. 10(a) through 10(j), several additional embodiments of ESD protection structures are illustrated.

Figure 10A:
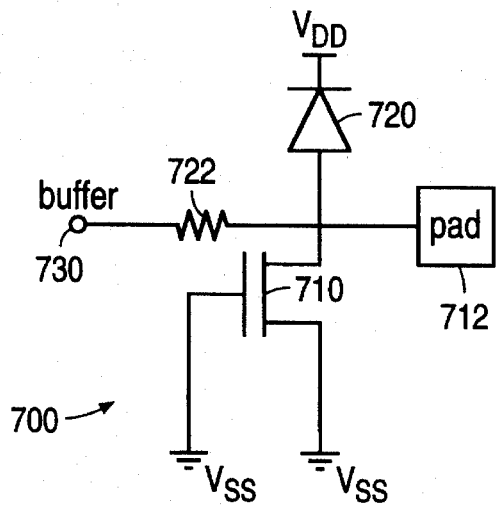
FIGS. 10(a) through 10(j) illustrate several additional embodiments of ESD protection structures.

A basic structure of a protection structure 700 is shown in FIG. 10(a). The protection structure 700 includes a grounded-gate NMOS transistor 710 which protects against bonding pad 712 to $V_{SS}$ ESD spikes of either positive or negative polarity. The protection structure 700 also includes a P+N− diode 720 which protects against positive and negative ESD spikes from the bonding pad 712 to $V_{DD}$. A diffusion resistor 722 isolates the protection structure 700 from the output buffer 730.

Figure 10B:
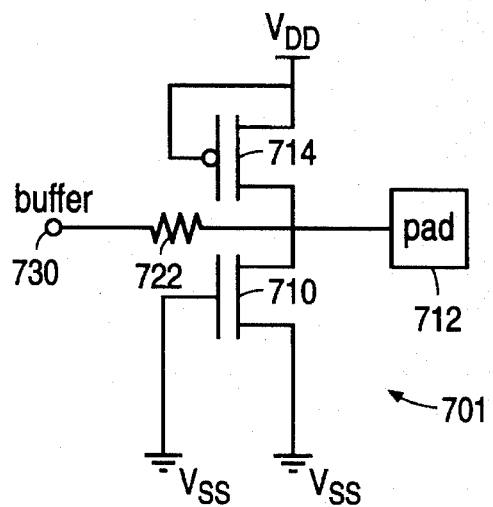
Figure 10C:
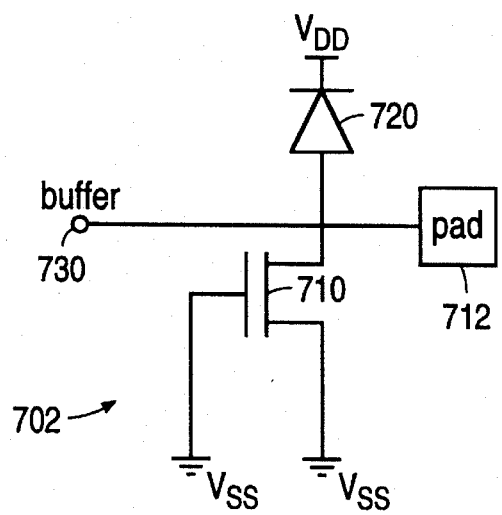

A protection structure 701 shown in FIG. 10(b) includes a PMOS transistor 714 to replace the P+N− diode 720. In a protection structure 702 shown in FIG. 10(c), the series isolation resistor 722 is eliminated. Protection structure 703, shown in FIG. 10(d) utilizes a resistor 716 connected to the gate of the NMOS transistor 710. Resistor 716 enables the gate potential to be elevated during a positive ESD spike from the bonding pad 712 with respect to $V_{SS}$ due to capacitive coupling between the drain and gate of NMOS transistor 710.

Figure 10D:
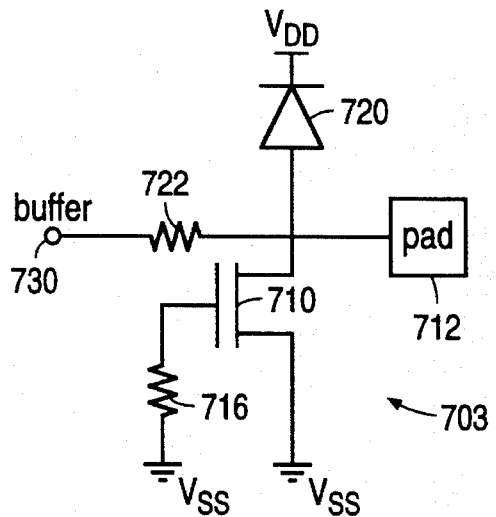
Figure 10E:
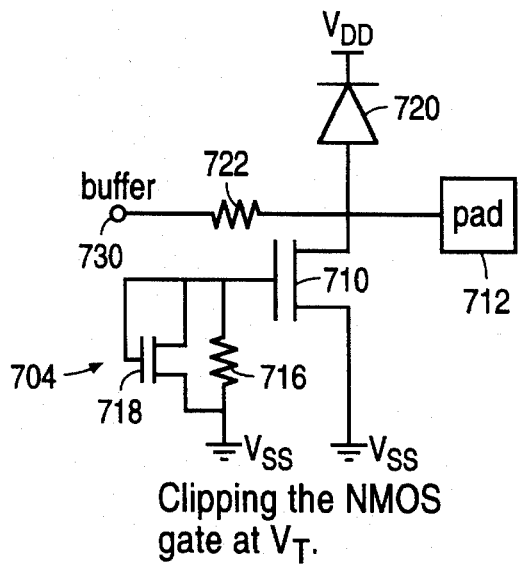

A protection structure 704 shown in FIG. 10(e) includes a clamping transistor 718 connected to the gate of NMOS transistor 710 to prevent the gate voltage from climbing higher than a threshold voltage $V_T$.

Figure 10F:
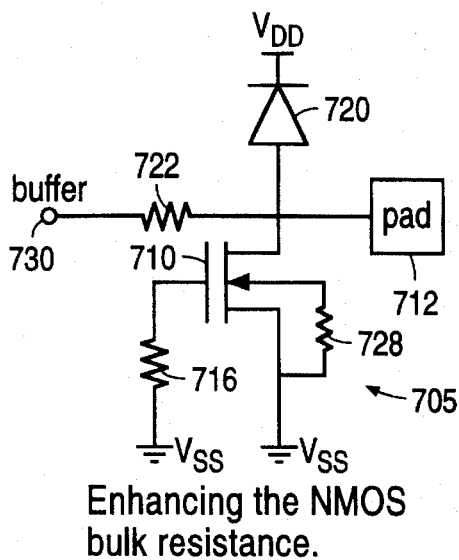

A protection structure 705 shown in FIG. 10(f) is similar to protection structure 703 illustrated in FIG. 10(d) except that supply taps (not shown) of the NMOS transistor 710 are removed from the transistor 710 by some distance to enable snap-back to occur at a lower drain current magnitude.

Figure 10G:
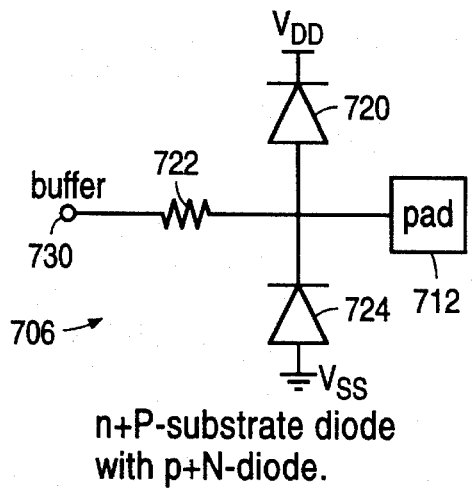

In a protection structure 706 shown in FIG. 10(g), NMOS transistor 710 is replaced by a N+P− diode 724. A diode, either an N+P− diode or a P+N− diode, has a larger series resistance in the stress discharge path than a lateral bipolar transistor. This larger series resistance results because of a relatively large distance between opposite composite N+ type and P+ type semiconductor materials, which is commonly dictated by process design rules as are known in the art of semiconductor fabrication. The diode 724, even when constructed of fingers, is uniformly activated since it has no voltage snap-back.

Figure 10H:
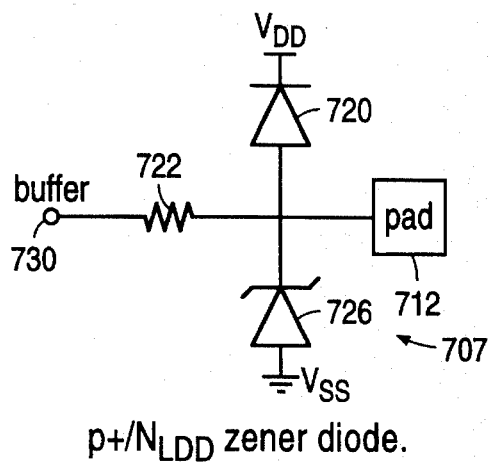
Figure 10I:
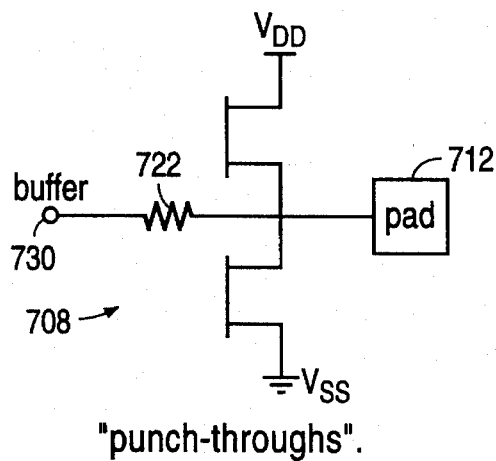
Figure 10J:
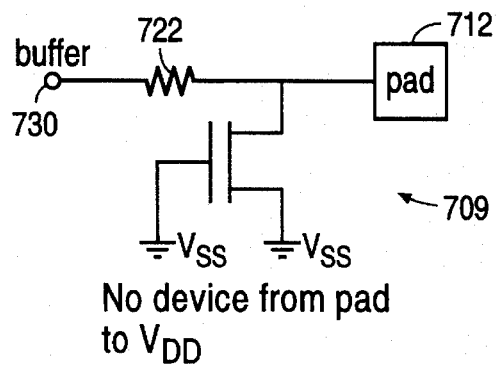

In a protection structure 707 shown in FIG. 10(h), NMOS transistor 710 is replaced by a zener diode 726. The zener junction is formed by a P+ to $N_{LDD}$ contact. Zener diodes are diodes with impurity concentrations, on both the N and P sides, higher than N−/P− bulk concentrations. In a standard CMOS process, a zener diode is fabricated using a lightly-doped drain (LDD) layer to form an avalanche breakdown voltage in the range of 7 V as compared to a bulk diode, which has a breakdown voltage in the range of about 12.5 V. Advantages of the zener diode 726 in comparison to a bulk diode are the lower breakdown voltage and a lower series resistance. A disadvantage of the zener diode 726 is a higher leakage current at normal operation voltages.

Protection structure 708 shown in FIG. 10(*i*) illustrates a "punch-through" device. The term "punch-through device" refers to a device formed using an NMOS transistor including drain and source diffusions and a thick oxide layer between the drain and source, but eliminating the gate. An advantage of a punch-through device is a lack of thin oxide. A minimum distance between the drain and source diffusions is dictated by design rules relating to the distance between two N-type composites. Because this distance is larger than the length of the depletion region formed in the drain, when the drain potential is $V_{t1}$ the device essentially never reaches the punch-through condition between drain and source. Instead the ESD stress discharge operates in the manner of an NMOS transistor with the missing gate left essentially floating. When a gate floats, an NMOS transistor is more susceptible to dispersal ESD thresholds and low voltage failures. When a punch-through effect is desired, N-wells are used at the "source" and "drain" of the device, thereby enlarging the depletion region during ESD stress.

Protection structure 709 shown in FIG. 10(*j*) has no device connected between the bonding pad 712 and $V_{DD}$. Protection structure 709 is particularly useful for mixed voltage systems such as 3 V/5 V systems where the potential at the bonding pad 712 can be higher than $V_{DD}$. When protection structure 709 is stressed from $V_{DD}$ to the bonding pad 712 in either a positive or negative direction, a current path through the $V_{DD}/V_{SS}$ diodes is closed. The $V_{DD}$ and $V_{SS}$ pads are accompanied by p+N− and N+P− diodes, respectively.

In the various embodiments of a protection structure shown in FIGS. 10(*a*) through 10(*j*), lightly doped drain (LDD) structures are alternatively included or omitted.

Figure 11:
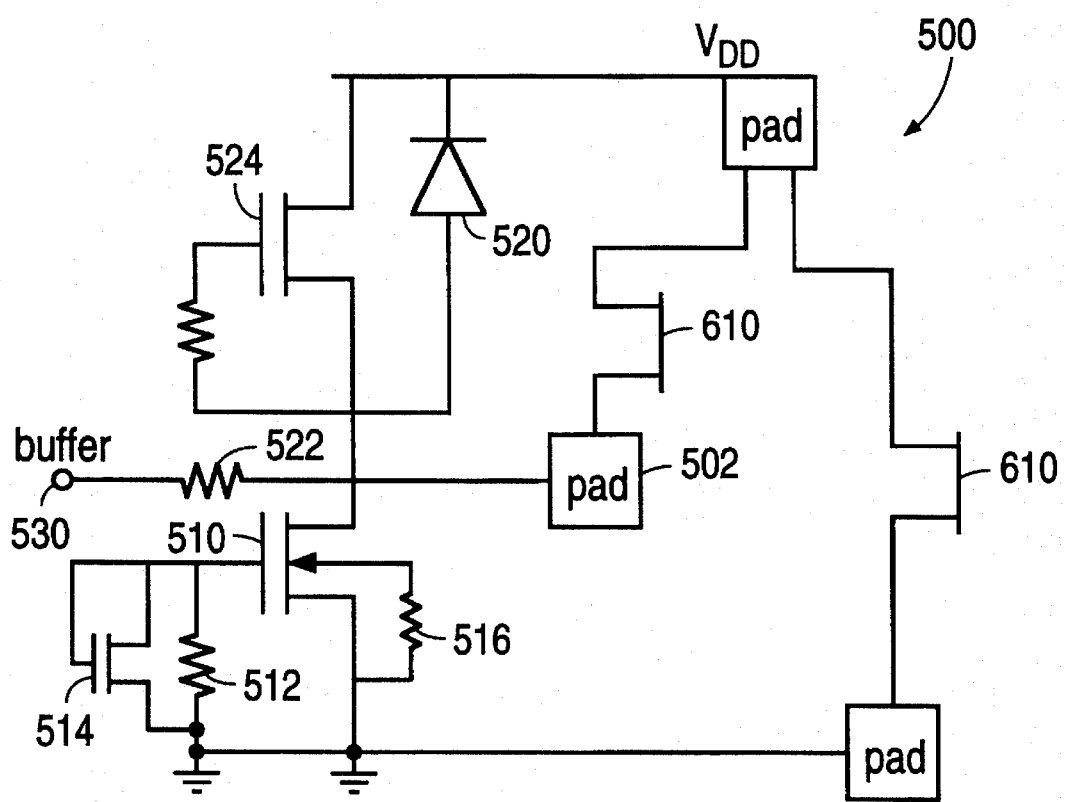

Referring to FIG. 11, a schematic circuit diagram shows a protection circuit which combines protection structures shown in FIG. 7 and FIG. 9 to protect against ESD stress in pad to $V_{SS}$ and pad to $V_{DD}$ paths and also protecting pad to pad paths.

The description of certain embodiments of this invention is intended to be illustrative and not limiting. Numerous other embodiments will be apparent to those skilled in the art, all of which are included within the broad scope of this invention.

What is claimed is:

1. An electrostatic discharge (ESD) protection circuit connected to a pad of a semiconductor integrated circuit comprising:

an NMOS transistor having a gate and a source/drain pathway coupled between the pad and ground;

a resistor coupled between the NMOS transistor gate and ground; and a clamping transistor having a source/drain pathway coupled between the NMOS transistor gate and ground and having a gate coupled to the NMOS transistor gate.

2. A circuit according to claim 1 further comprising:

an elevated substrate resistance at the NMOS transistor.

3. A circuit according to claim 2 wherein:

supply taps are positioned at a distance removed from the NMOS transistor so that the substrate resistance at the NMOS transistor is elevated.

4. A circuit according to claim 1 wherein:

the pad is a bonding pad for connecting a VDD voltage source.

5. A circuit according to claim 1 wherein the NMOS transistor is a first NMOS transistor, the circuit further comprising:

a second NMOS transistor having a gate and having a source/drain pathway coupled between a VDD supply voltage source and the pad; and a resistor coupled between the gate of the second NMOS transistor and the pad.

6. A circuit according to claim 5 further comprising:

a diode coupled between the VDD supply voltage source and the pad.

7. A circuit according to claim 6 wherein the diode is a P+N− diode.

8. A circuit according to claim 1 further comprising:

a diode coupled between the VDD supply voltage source and the pad.

9. A circuit according to claim 8 wherein the diode is a P+N− diode.

10. A circuit according to claim 1 wherein the pad is connected to a buffer, the circuit further comprising:

a diffusion resistor coupled between the pad and the buffer.

11. A circuit according to claim 10 further comprising:

a well tab positioned under the diffusion resistor.

12. An electrostatic discharge (ESD) protection circuit connected to a pad of a semiconductor integrated circuit comprising:

a first NMOS transistor having a gate coupled to ground and a source/drain pathway coupled between the pad and ground;

a second NMOS transistor having a gate and a source/drain pathway coupled between the VDD supply voltage source and the pad; and a resistor coupled between the gate of the second NMOS transistor and the pad.

13. A circuit according to claim 12 further comprising:

a diode coupled between the VDD supply voltage source and the pad.

14. A circuit according to claim 13 wherein the diode is a P+N− diode.

15. A circuit according to claim 12 wherein the pad is connected to a buffer, the circuit further comprising:

a diffusion resistor coupled between the pad and the buffer.

16. A circuit according to claim 14 further comprising:

a well tab positioned under the diffusion resistor.

17. An electrostatic discharge (ESD) protection circuit connected between two pads of a semiconductor integrated circuit comprising:

a field oxide transistor coupled between the two pads, the field oxide transistor including:

a source diffusion;

a drain diffusion; and an oxide layer between the drain and source diffusions; and an N-well formed under the source diffusion; and an N-well formed under the drain diffusion.

18. An electrostatic discharge (ESD) protection circuit according to claim 17 wherein the field oxide transistor is a gateless field oxide transistor.

19. An electrostatic discharge (ESD) protection system for protecting an integrated circuit having a plurality of transistors, a plurality of pads for connecting an input line, an output line, a VDD power supply line and a VSS ground reference line, the system comprising:

a first protection structure coupled between a pad of the plurality of pads and a pad of the plurality of pads coupled to the $V_{SS}$ ground reference line and coupled between a pad of the plurality of pads and a pad of the plurality of pads coupled to the $V_{DD}$ power supply line for respectively protecting against ESD stress in pad to $V_{SS}$ and pad to $V_{DD}$ paths; and a second protection structure coupled between a first pad of the plurality of pads and a second pad of the plurality of pads for protecting pad to pad electrical paths.

20. A system according to claim 19, further comprising:

a third protection structure coupled between a pad of the plurality of pads coupled to the $V_{DD}$ power supply line and a pad of the plurality of pads coupled to the $V_{SS}$ ground reference line for preventing the $V_{DD}$ potential from rising above the snap-back voltage of the transistors.

21. A system according to claim 20, wherein the third protection structure further comprises:

a field oxide transistor coupled between the pad of the plurality of pads coupled to the $V_{DD}$ power supply line and the pad of the plurality of pads coupled to the $V_{SS}$ ground reference line, the field oxide transistor including:

a source diffusion;
a drain diffusion; and
an oxide layer between the drain and source diffusions; and an N-well formed under the source diffusion; and
an N-well formed under the drain diffusion.

22. A system according to claim 19, wherein the first protection structure further comprises:

an NMOS transistor having a gate and a source/drain pathway coupled between a pad of the plurality of pads and the pad of the plurality of pads coupled to the $V_{SS}$ ground reference line;

a resistor coupled between the NMOS transistor gate and the pad of the plurality of pads coupled to the $V_{SS}$ ground reference line; and a clamping transistor having a source/drain pathway coupled between the NMOS transistor gate and the pad of the plurality of pads coupled to the $V_{SS}$ ground reference line and having a gate coupled to the NMOS transistor gate.

23. A system according to claim 22, wherein the NMOS transistor is a first NMOS transistor, the first protection structure further comprising:

a second NMOS transistor having a gate and having a source/drain pathway coupled between the pad coupled to the VDD supply voltage source and a pad of the plurality of pads; and a resistor coupled between the gate of the second NMOS transistor and the pad of the plurality of pads.

24. A system according to claim 23, wherein the first protection structure further comprises: a P+N- diode coupled between the VDD supply voltage source and a pad of the plurality of pads.

25. A system according to claim 19, wherein the second protection structure further comprises:

a field oxide transistor coupled between the pad of the plurality of pads coupled to the $V_{DD}$ power supply line and the pad of the plurality of pads coupled to the $V_{SS}$ ground reference line, the field oxide transistor including:

a source diffusion;
a drain diffusion; and
an oxide layer between the drain and source diffusions; and an N-well formed under the source diffusion; and
an N-well formed under the drain diffusion.

* * * * *